(12) United States Patent
Kato et al.

(10) Patent No.: US 10,622,531 B2
(45) Date of Patent: Apr. 14, 2020

(54) LIGHT-EMITTING DEVICE

(71) Applicant: NICHIA CORPORATION, Anan-shi, Tokushima (JP)

(72) Inventors: Yasuo Kato, Anan (JP); Yuichi Hamada, Tokushima (JP); Kensaku Hamada, Komatsushima (JP); Takanori Akaishi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/140,111

(22) Filed: Sep. 24, 2018

(65) Prior Publication Data

US 2019/0097107 A1    Mar. 28, 2019

(30) Foreign Application Priority Data

Sep. 28, 2017 (JP) .................................. 2017-187425
Aug. 22, 2018 (JP) .................................. 2018-155131

(51) Int. Cl.
*H01L 33/00* (2010.01)
*H01L 33/62* (2010.01)
(Continued)

(52) U.S. Cl.
CPC .............. *H01L 33/62* (2013.01); *H01L 24/45* (2013.01); *H01L 33/36* (2013.01); *H01L 24/29* (2013.01); *H01L 24/43* (2013.01); *H01L 24/48* (2013.01); *H01L 24/73* (2013.01); *H01L 2224/2929* (2013.01); *H01L 2224/29111* (2013.01); *H01L 2224/29144* (2013.01); *H01L 2224/29339* (2013.01); *H01L 2224/29344* (2013.01); *H01L 2224/29347* (2013.01); *H01L 2224/32245* (2013.01); *H01L 2224/43125* (2013.01); *H01L 2224/43848* (2013.01); *H01L 2224/45015* (2013.01); *H01L 2224/45139* (2013.01); *H01L 2224/45147* (2013.01);
(Continued)

(58) Field of Classification Search
CPC ......... H01L 33/00; H01L 33/36; H01L 24/45; H01L 24/48; H01L 2224/29111; H01L 2224/29144
See application file for complete search history.

(56) References Cited

U.S. PATENT DOCUMENTS 9,812,421 B2* 11/2017 Uno ........................ H01L 24/45
2004/0005498 A1* 1/2004 Eshraghi ............... H01M 2/162
429/140
(Continued)

FOREIGN PATENT DOCUMENTS

JP    2007-080990 A    3/2007
JP    2011-035020 A    2/2011
(Continued)

*Primary Examiner* — Phuc T Dang
(74) *Attorney, Agent, or Firm* — Global IP Counselors, LLP

(57) ABSTRACT

A light-emitting device includes a light emitting element having a pad electrode, and a metal member connected to the pad electrode via a wire. The wire has a layered structure including at least a core material containing copper as a main component, an intermediate layer containing palladium as a main component, and a surface layer containing silver as a main component. The intermediate layer is arranged between the core material and the surface layer.

8 Claims, 3 Drawing Sheets

(51) Int. Cl.
*H01L 23/00* (2006.01)
*H01L 33/36* (2010.01)

(52) U.S. Cl.
CPC ............ *H01L 2224/45572* (2013.01); *H01L 2224/45639* (2013.01); *H01L 2224/45644* (2013.01); *H01L 2224/45664* (2013.01); *H01L 2224/48091* (2013.01); *H01L 2224/48247* (2013.01); *H01L 2224/48257* (2013.01); *H01L 2224/73265* (2013.01); *H01L 2224/83424* (2013.01); *H01L 2224/83439* (2013.01); *H01L 2924/12041* (2013.01)

(56) References Cited

U.S. PATENT DOCUMENTS

| | | | |
|---|---|---|---|
| 2009/0095972 | A1 | 4/2009 | Yasuda |
| 2010/0006887 | A1* | 1/2010 | Takei ................... C08G 59/24 257/100 |
| 2012/0118610 | A1 | 5/2012 | Terashima et al. |
| 2012/0305962 | A1 | 12/2012 | Won et al. |

FOREIGN PATENT DOCUMENTS

| | | |
|---|---|---|
| JP | 2012-036490 A | 2/2012 |
| JP | 2012-039079 A | 2/2012 |
| JP | 2015-144199 A | 8/2015 |
| WO | 2011013527 A1 | 2/2011 |

* cited by examiner

LIGHT-EMITTING DEVICE

CROSS-REFERENCE TO RELATED APPLICATION

This application claims priority to Japanese Patent Application No. 2017-187425 filed on Sep. 28, 2017, and Japanese Patent Application No. 2018-155131 filed on Aug. 22, 2018, the disclosures of which are hereby incorporated by reference in then entireties.

BACKGROUND

The present disclosure relates to a light-emitting device. A covered wire including a wire core material containing copper as its main component and coated with a substance having high reflectance has been proposed as a wire for connecting a pad electrode of a semiconductor light emitting element (hereinafter also referred to simply as a "light emitting element") to an electrode of a package.

SUMMARY

However, for example, in Japanese Unexamined Patent Application Publication No. 2007-80990, although copper is used as the wire core material and silver is used to increase the light extraction efficiency, the copper in the core material tends to thermal-diffuse into the silver in the surface layer.

Also, for example, Japanese Unexamined Patent Application Publication No. 2012-039079 proposes a covered copper wire in which the core material is composed of copper, an intermediate layer is composed of Pd, and a surface layer is composed of silver.

With these covered wires, the light extraction efficiency tends to decrease over an extended period of time.

A light-emitting device according to an embodiment of the present disclosure includes a light emitting element having a pad electrode, and a metal member connected to the pad electrode via a wire. The wire has a layered structure including at least a core material containing copper as a main component, an intermediate layer containing palladium as a main component, and a surface layer containing silver as a main component. The intermediate layer is arranged between the core material and the surface layer.

It is possible to obtain a light emitting device with which the light extraction efficiency tends not to decrease when the light emitting device is driven for an extended period of time.

DETAILED DESCRIPTION OF EMBODIMENTS

Figure 1A:
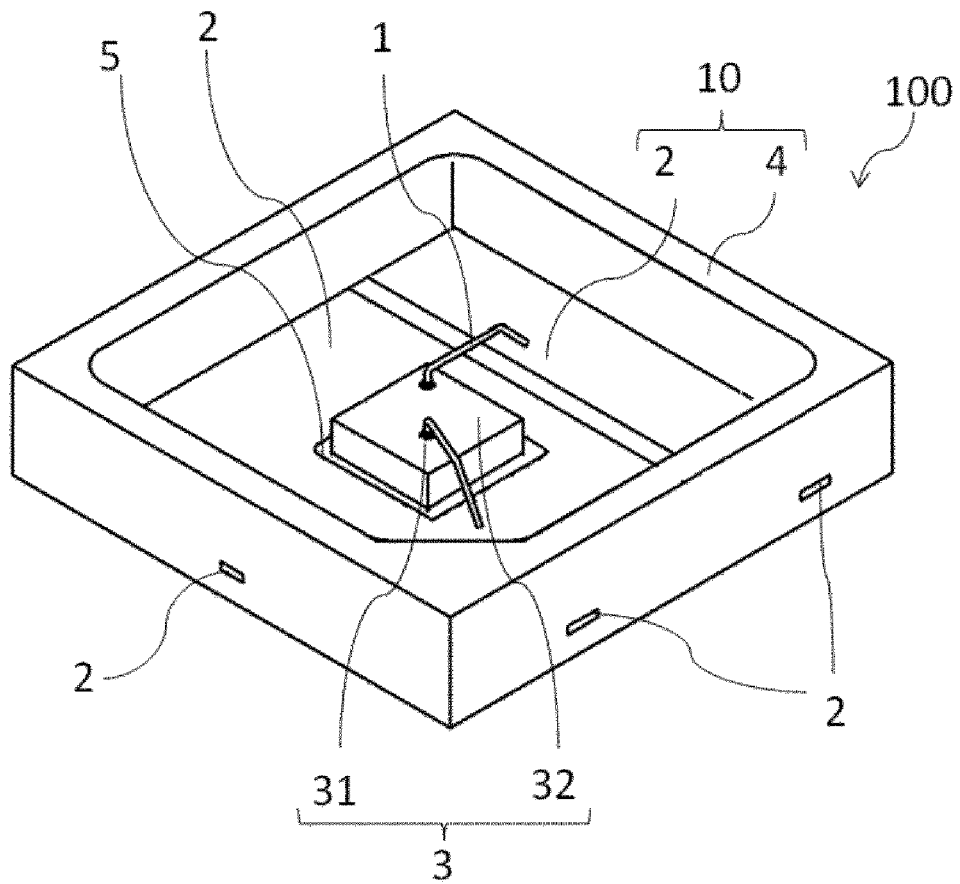
FIGS. 1A and 1B are schematic cross-sectional views representing a light emitting device of an embodiment.

Hereafter, embodiments of the present invention are explained while referring to the drawings as appropriate. However, the mounting component, the light emitting device explained hereafter is for embodying the technical concept of the present invention, and unless specifically noted, the present invention is not limited to the following. Also, in the present specification, members disclosed in Claims are never limited to the members in the embodiment. In particular, unless specifically stated otherwise, the sizes, materials, shapes, and relative positions of constituent components described in the embodiment do not limit the scope of the present disclosure to the aforementioned descriptions only but merely provide examples for illustration. It is noted that there is a case where magnitudes or positional relations of members illustrated in each drawing are exaggerated in order to clarify the descriptions.

As shown in FIG. 1A (in which the sealing member 6 is not shown for the sake of brevity) and 1B, a light emitting device 100 has a package 10, a light emitting, element 3 placed on the package 10, and wires 1. The package 10 has metal members 2 functioning as a pair of positive and negative electrodes, and a resin molding 4 that holds the metal members 2 together. The light emitting element 3 has a semiconductor stacked structure 32 including a light emitting layer, and pad electrodes 31 formed on the upper surface of the stacked structure 32. The wires 1 connect the metal members 2 and the pad electrodes 31. The metal members 2 function as mounting members on which the light emitting element 3 is mounted. The metal members 2 also function as a pair of positive and negative electrodes for supplying power to the light emitting element 3 via the wires 1.

Figure 2:
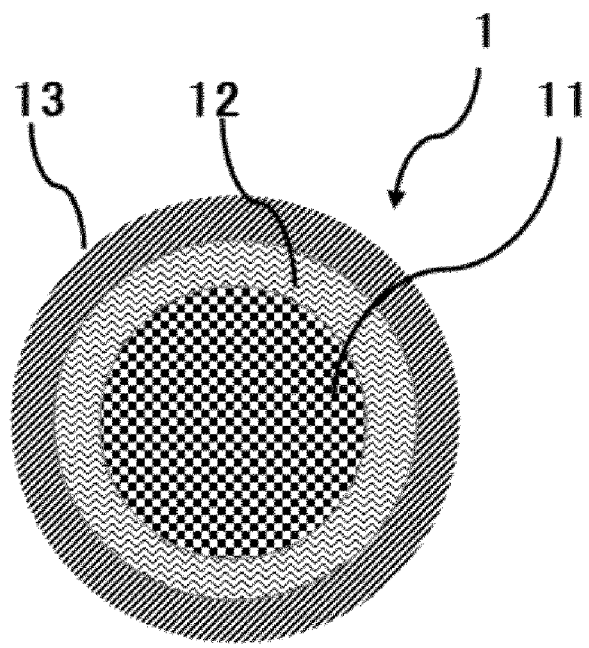
FIG. 2 is a schematic cross-sectional view representing a multilayer be wire of an embodiment.

As shown in the schematic cross-sectional view in FIG. 2, the wire 1 in this embodiment has a core material 11 containing copper as its main component, an intermediate layer 12 containing palladium as its main component, and a surface layer 13 containing silver as its main component. The diameter of the core material 11 whose main component is copper is from 10 μm to 30 μm, for example. The thickness of the intermediate layer 12 whose main component is palladium is from 30 am to 100 nm, for example. The thickness of the surface layer 13 whose main component is silver is from 40 nm to 300 nm, for example.

Wire 1

The wires 1 electrically connect the metal members 2 and the pad electrodes 31 of the light emitting element 3. The wire 1 is illustrated in FIG. 2. The wire 1 in this embodiment has a layered structure including at least the core material 11 containing copper as its main component, the intermediate layer 12 whose main component is palladium and which coats the surface of the core material 11, and the surface layer 13 whose main component is silver and which coats the surface of the intermediate layer 12.

The core material 11 contains copper as its main component, and preferably contains at least 95% copper, and more preferably at least 97% copper. The core material 11 may be suitably doped with Au, Ag, Zn, Sn, V, B, Ti, Mg, P, S or another such additive, or with an alloy, depending on the bondability, the ease of ball formation, the appropriate elongation, the appropriate loop shape, the appropriate hardness, and other such productivity factors, as well as the shape of the light emitting device 100, etc. The diameter of the core material 11 can be appropriately selected according to the shape, output, and so forth of the light emitting device 100. The diameter of the core material 11 is preferably at least 10 μm and no more than 30 μm, for example.

The intermediate layer 12 preferably contains palladium as its main component, preferably containing least 90% palladium, more preferably at least 95% palladium. The intermediate layer 12 preferably contains at least one element selected from the group containing Cu, Te, Ge, Se, Au, Ag. The intermediate layer 12 may be suitably doped with an additive or an alloy, depending on the heat resistance, corrosion resistance, oxidation resistance, bondability, ease of ball formation, the appropriate elongation, the appropriate loop shape, the appropriate hardness, and other such productivity factors as well as the shape of the light emitting device 100. The intermediate layer 12 may contain a trace amount of Se, Ge, Bi, Te or the like, for example, which is expected to improve the heat resistance. In the case that the palladium intermediate layer is manufactured by electroplating, the plating solution may be one to which these additives have been added.

The surface layer preferably contains at least one element selected from the group containing Pd, Au, Se, S, C, N, O. Alternatively, it is particularly preferable for the surface layer 13 having silver as its main component to be made of high-purity silver that does not include anything but unavoidable impurities. The surface layer 13 may contain a trace amount of additives such as Se S or the like in order to improve heat resistance and light reflectance. In the case that a surface layer 13 having silver as its main component is manufactured by electroplating, the silver plating solution may be one to which a selenium compound and/or a sulfur compound have been suitably added as additives.

The method for manufacturing the wire 1 is as follows. First, a core material 11 having a diameter larger than the diameter of the target wire is prepared, plating layers that are thicker than the targeted intermediate lay and surface layer are formed, and then wire drawing is performed. The core material, the intermediate layer, the surface layer, and the wire will be described using the same names for these components both before and after wire drawing.

The core material 11, which usually has a diameter of 2 to 6 mm, is wound in a coil, and has copper as its main component, is first electroplated with palladium in a thickness of a few microns (which serves as the intermediate layer 12), after which this product is electroplated with silver in a thickness of a few microns (which serves as the surface layer 13). The wire having a diameter of a few millimeters manufactured in this way can be repeatedly drawn through a wire drawing die having an appropriate hole shape while undergoing heat treatment, to produce a wire with a diameter of 10 to 30 µm, the example. It is preferable to adjust the plating thickness of palladium or silver formed in the plating step before wire drawing, depending on the extent of subsequent wire drawing. Since the wire drawing is thus performed while the material is heated, heat will be inter-diffused near the interfaces between the core material 11, the intermediate layer 12, and the surface layer 13, so a certain amount of alloying occurs. The degree of alloying is preferably adjusted by adjusting the conditions such as the temperature and duration of the heat treatment, and thereby adjusting the properties of the wire 1.

The desired wire 1 can be produced by using a core material 11 that has a diameter of 25 µm and has copper as its main component, electroplating this with the intermediate layer 12 (containing palladium) and then the surface layer 13 (containing silver), without performing wire drawing.

Package 10

The light emitting device 100 in this embodiment has the package 10 having at least the metal members 2. The package 10 may have metal members 2 and an insulating base 4.

Figure 1B:
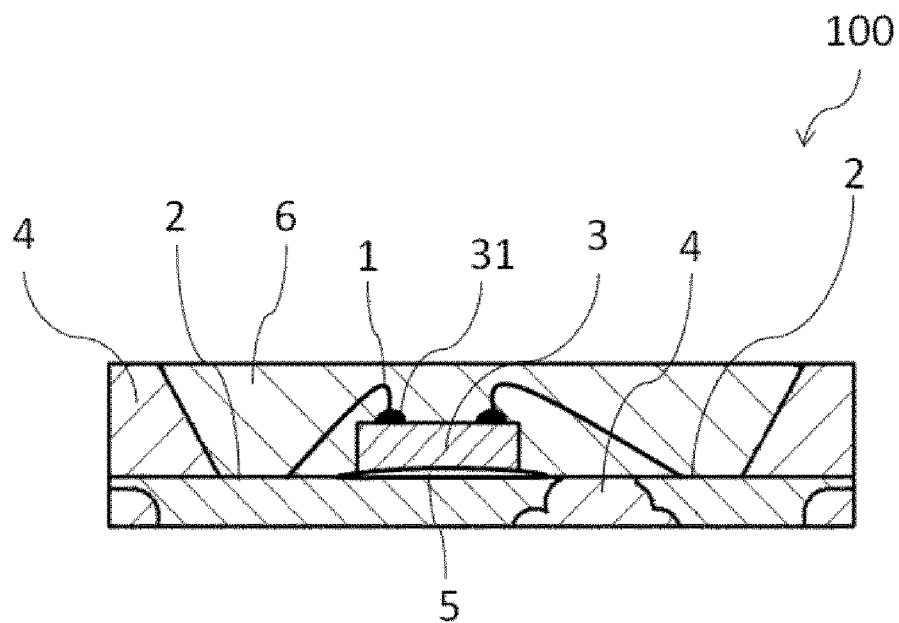

For example, the package 10 has a quadrangular outer peripheral shape in plan view and has a recessed portion having an opening on its upper surface. For example, the recessed portion is such that the opening, where the metal members 2 are exposed on the bottom surface, has a square shape in plan view. Part of the pair of metal members 2 is exposed as an external terminal portion on the lower surface of the package 10. The shape of the package 10 in plan view may be something other than quadrangular, such as a rectangle shape, a polygonal shape, or a combination thereof. In the case where the package 10 of the light emitting device 100 has a recessed portion, the inside surfaces of the side wall portions of the recessed portion may be provided at an angle inclined to the bottom surface as shown in FIG. 1B, or at a substantially vertical angle, or may have a stepped surface on these inside surfaces. The height of the walls, the shape of the opening, and so forth can also be appropriately selected as dictated by the goal or intended application. It is preferable to provide the metal members 2 inside the recessed portion, and a metal member may be provided to the side wall portions in addition to the bottom surface as in this embodiment.

Metal Member 2

The metal member 2 can function as a light reflecting member having high reflection of the light from the light emitting element 3. For example, the metal member 2 has a gold- or silver-containing layer on its surface and is provided to the light emitting device 100 so that the light emitted from the light emitting element 3 or a wavelength conversion member (discussed below) will be efficiently reflected.

In the case where the metal member 2 is used as a light reflecting member, it may be used in any form in the light emitting device 100 so long as it can reflect the light emitted from the light emitting element 3. For instance, as shown in FIG. 1A, etc., it may be disposed below the light emitting element 3, or may be provided in the form of a reflector that surrounds the light emitting element 3. Also, the metal member 2 may be a lead frame with a flat shape as shown in FIG. 1A, etc., or may be wiring formed on an insulating base. The metal member 2 may also serve as a mounting member on which the light emitting element 3 is mounted, a heat dissipating member for dissipating heat, and a metal member electrically connected to the light emitting element 3. Therefore, the metal member 2 preferably has excellent heat dissipation properties, electrical conductivity, and bonding properties, as dictated by its function.

The surface of the metal member 2 preferably has a reflectance of at least 70%, and more preferably at least 80%, with respect to light whose wavelength is in the visible light band. This improves the light extraction efficiency. The surface is also preferably high-glossy, with a brightness of at least 0.5, preferably at least 1.0, and more preferably at least 1.6. The brightness referred to here is a number obtained from light that is received perpendicularly at 4-55° irradiation using a micro surface color difference meter VSR 300A made by Nippon Denshoku Industries Co., Ltd. The surface of the metal member preferably includes at least one element selected from among Ag, Au, Pd, Rh, Pt. It is particularly preferable for the surface of the metal member to be a layer containing Au or Ag.

The Au- or Ag-containing layer of the metal member 2 may be provided over the entire surface at the metal member 2, or relay be partially provided on the surface of the metal member 2. That is, at least part of the surface of the metal member 2 may be provided with an Au- or Ag-containing layer. For example, with the light emitting device 100 shown in FIGS. 1A and 1B, it is preferable in the case where the metal member 2 is exposed on the bottom surface of the recessed portion, and an Ag-containing layer having high reflectivity is provided to the surface of the metal member 2 in the portion irradiated with the light from the light emitting element 3. Also, of the metal member 2, the embedded part that is embedded in the side wall portion of the base 4, the external terminal part that is exposed on the outside of the base 4, and the mounting portion that is exposed on the lower surface side of the fight emitting device 100 need not be provided with an Au- or Ag-containing layer on their surface. When an Au- or Ag-containing layer is thus provided to part of the metal member 2, this is accomplished by masking off and protecting the portion where no Au- or Ag-containing layer is formed with a resist, protective tape, or the like at the time of film formation.

The Au- or Ag-containing layer of the metal member 2 may have the same thickness over the entire region, or the thickness may vary. The cost can be reduced by partially reducing the thickness of the Au- or Ag-containing layer. For example, the Au- or Ag-containing layer can be provided on the upper and lower surfaces of the metal member 2, and the thickness on one side can be thicker than on the other. Providing a thick Au- or Ag-containing layer on the upper surface of the metal member 2 on which the light emitting element 3 is placed and in the vicinity of the light emitting element 3 is preferable from the standpoint of improving the light extraction efficiency. Since the Au- or Ag-containing layer with high reflectance is not provided to the lower surface of the metal member, the amount of Au, Ag, or other such material can be reduced, and the cost of the metal member 2 can be reduced.

In order to form an Au- or Ag-containing layer on the surface of the metal member 2, plating is a preferable method from the standpoint of mass productivity. In part during forming the layer by electroplating, brightness can be improved by using a selenium-based brightener, an antimony-based brightener, a sulfur-based brightener, a titanium additive, a lead additive, an arsenic brightener, an organic brightener, or another such brightener or additive. This makes it possible to obtain a metal member 2 having high gloss while still having excellent corrosion resistance.

Also, in order to increase the light reflectance of the metal member 2, the flatness of the base material is preferably as high as possible. For example, it is preferable for the surface roughness Ra to be 0.5 µm or less. Consequently, the flatness of the Au- or Ag-containing layer provided on the base material can be increased, and the light reflectance of the metal member 2 can be preferably enhanced. The flatness of the base material can be enhanced by performing treatments such as rolling, physical polishing, chemical polishing, and the like.

Base 4

The package 10 of the light emitting device 100 includes the base 4. The base 4 is a member that is based on a resin and holds the pair of metal members 2 together.

The base 4 can be a thermosetting resin or a thermoplastic resin, and it is particularly preferable to use a thermosetting resin. The thermosetting resin is preferably one fining a lower gas permeability than the resin used for the sealing member 6 (discussed below), specific examples of which include epoxy resin compositions, a silicone resin compositions, modified epoxy resin compositions such as a silicone modified epoxy resin, modified silicone resin compositions such as an epoxy modified silicone resin, polyimide resin compositions, modified polyimide resin compositions, urethane resins, modified urethane resins, and the like. It is preferable to adjust the transmissivity of light by mixing microparticles such as $TiO_2$, $SiO_2$, $Al_2O_3$, MgO, $MgCO_3$, $CaCO_3$, $Mg(OH)_2$, $Ca(OH)_2$ as a filler into the base material of the base 4 so as to reflect about 60% or more of the light from the light emitting element, and more preferably about 90%.

The base 4 is not limited to one that is based on a resin as described above, and may instead be formed from an inorganic material such as a ceramic, glass, metal, or the like. This makes it possible to obtain a highly reliable light emitting device 100 with less deterioration, etc.

Light Emitting Element 3

As shown in FIG. 1 for example, the light emitting element 3 can be placed on the metal member 2 exposed on the bottom surface of the recessed portion of the package 10. The light emitting element 3 is preferably mounted on a metal member 2 having high reflectance and/or high gloss. This improves the light extraction efficiency of the light emitting device 100.

The light emitting element 3 can be selected from among semiconductor light emitting elements of the desired wavelength. The light emitting element 3 has a stacked structure 32 equipped with a semiconductor layer including a light emitting layer or the like, and pad electrodes 31. As for the stacked structure 32, in the case where it is a light emitting element 3 that emits blue or green light, for example, GaP or a nitride-based semiconductor such as InGaN, GaN, AlGaN or the like can be used. In the case where it is a red light emitting element, GaAlAs or the like can be used for the stacked structure 32. Furthermore, a light emitting element 3 composed of other materials ran be used. The composition, emission color, size, number and so forth of the light emitting elements 3 to be used can be suitably selected according to the application.

In the vase that the light emitting device 100 has a wavelength conversion member, then a nitride semiconductor capable of emitting light with a short wavelength capable of efficiently exciting the wavelength conversion member will be preferable as the stacked structure 32 of the light emitting element 3. The stacked structure 32 of the light emitting element 3 can have any of various emission wavelengths selected according to the material of the semiconductor layer and the mixed crystal ratio thereof. Also, the light emitting element 3 can output not only light, in the visible light band, but also ultraviolet light and infrared light.

The light emitting element 3 has positive and negative pad electrodes 31 electrically connected to the metal member 2. These positive and negative electrodes may be provided on one side, or may be provided on both the upper and lower surfaces of the light emitting element 3. It is preferable for the suffice of the pad electrode to be made of at least one of Al, Pd, Pt, Rh, Ru and the like. The metal member 2 functioning as a conductive member and the light emitting element 3 may be connected to each other by just the wire 1, or in addition to the wire 1, a conductive joining member 5 may be used as a joining member 5 for use in connecting these.

In the case that a plurality of light emitting elements 3 are provided, the pad electrodes 31 of the light emitting elements 3 may be connected to each other by the wires 1. Also, in the case that a plurality of light emitting elements 3 are provided, as shown in FIGS. 1A and 1B, it is also possible to provide connecting leads for each of the light emitting elements 3.

Joining Member 5

The joining member 5 is a member for fixing, and mounting the light emitting element 3 on the package 10. As for preferable materials, the conductive joining member 5 can be a conductive paste such as Ag, Au, Pd and the like, a eutectic solder material such as Au—Sn or Sn—Ag—Cu, a brazing material such as a low melting point metal, a joint between the materials using a film or particles of Cu, Ag, Au or the like. The insulating, bonding member 5 can be an epoxy resin composition, a silicone resin composition, a polyimide resin composition, a modified version of one of these resins, a hybrid of theses resins, or the like. When one of these resins is used, in consideration of deterioration caused by light or heat from the light emitting element 3, a metal layer having high reflectance, such as an Al film or an Ag film, or a dielectric reflective film can be provided to the mounting surface of the light emitting element 3.

Sealing Member 6

The light emitting device 100 may have a sealing member 6. Providing the sealing member 6 so as to cover members such as the light emitting element 3, the metal member 2, the wire 1, and a protective film (discussed below) protects the covered members from dust, moisture, external force, and the like, and improves the reliability of the light emitting device 100. In particular, providing the sealing member 6 over the protective film after forming the protective film is preferable because the protective film can be protected, so reliability is further enhanced.

The sealing member 6 is preferably light-transmissive so that it can transmit the light from the light emitting element 3, and is light resistant so that it will not be readily degraded by light. Examples of specific materials include silicone resin compositions, modified silicone resin compositions, modified epoxy resin compositions, fluororesin compositions, and other such insulating resin compositions that are light-transmissive enough to be able to transmit the light from the light emitting element. A hybrid resin containing at least one type of resin having a siloxane skeleton as a base, such as dimethylsilicone, phenylsilicone having a low phenyl content, fluorine-based silicone resins, and the like can also be used.

When the sealing member 6 is a resin, the method for forming the sealing member 6 can be potting (dripping), compression molding, printing, transfer molding, jet dispensing, spray coating, or the like. In the case of a package 10 having a recessed portion as shown in FIGS. 1A and 1B, potting is a preferable method, and in the case where a flat package is used, compression molding and transfer molding are preferable methods.

As shown in FIG. 1B, the sealing member 6 can be provided so as to fill the inside of the recessed portion of the base 4.

The shape of the outer surface of the sealing member 6 can be variously selected according to the light distribution characteristics and so forth required cit the light emitting device 100. For example, the directivity characteristics and the light extraction efficiency of the light emitting device can be adjusted by giving the upper surface a convex lens shape, a concave lens shape, a Fresnel lens shape, a roughened surface, or the like.

The sealing member 6 can contain a colorant, a light diffusing agent, a metallic member, various fillers, a wavelength conversion member, etc.

The wavelength conversion member is a material that converts the wavelength of the light of the light emitting element 3. In the case where the light emitted from the light emitting element 3 is blue light, a yttrium-aluminium-garnet-based phosphor (hereinafter referred to as "YAG:Ce"), which is a type of aluminum oxide-based phosphor, can be used to advantage. Since a YAG:Ce phosphor absorbs some of the blue light from the light emitting element and emits yellow light that becomes complementary in color, a high-output light emitting device 100 that emits white mixed light can be formed with relative ease.

Protective Film

The light emitting device 100 may further have a protective film. The protective film is an insulating member that covers the metal member 2, the wire 1, and the like. More precisely, the protective film is a member that covers at least the silver-containing layer provided on the surface of the wire 1 or the metal member 2, and mainly suppresses discoloration or corrosion of the silver-containing layer on the surface of the wire 1 and the metal member 2. The surface of members other than the metal member 2, such as the wire 1, the light emitting element 3, the joining member 5, or the base 4 (resin molding), and the surface of the metal member 2 not provided with the silver-containing layer, may be covered. The protective film is a light-transmissive member. Therefore, the reflectance of the surface layer 13 of the wire 1 can be kept high. Examples of the material of the protective film include oxides such as $Al_2O_3$, $SiO_2$, $TiO_2$, $ZrO_2$, $ZnO$, $Nb_2O_5$, $MgO$, $In_2O_3$, $Ta_2O_5$, $HfO_2$, $SeO$, $Y_2O_3$, $SnO_2$, nitrides such as AlN, TiN, ZrN, and fluorides such as $ZnF_2$, $SrF_2$. These may be used alone or in mixtures. Alternatively, they may be stacked.

Since the main component of the surface layer 13 of the wire 1 is silver, covering the surface of the wire 1 with a protective film suppresses sulfidation and oxidation of the surface layer 13. Furthermore, in the case where the surface of the metal member 2 contains silver, then covering the surface with the protective film will prevent the silver from tarnishing due to sulfidation or oxidation.

The protective film is preferably provided continuously from the surface of the metal member 2 including the Au- or Ag-containing layer to the surfaces of the wire 1, the light emitting element 3, the joining member 5, the base 4, etc.

The protective film can be formed by sputtering or by chemical vapor deposition, it is particularly preferable to form it by atomic layer deposition (ALD). The ALD method forms a very uniform protective film, and the protective film that is formed will be denser than a protective film obtained by another film formation method, so sulfidation of the Ag-containing layer on the surface of the wire 1 or the member 2 can be prevented very effectively The light emitting device 100 can have various other members besides those described above. For instance, a Zener diode can be mounted as a protective element.

In Examples 1 to 4, the wire 1 shown in Table 1 was prepared, and the light emitting device 100 shown in FIGS. 1A and 1B was manufactured.

In Examples 1 to 4, commercially available copper wires having a diameter of 25 μm were purchased as the core material 11 in order to avoid the influence of heat treatment during wire drawing. After degreasing the copper wire, acid neutralization treatment was carried out with a 10% sulfuric acid aqueous solution.

Next, the intermediate layer 12 was applied by plating using the following bath composition.
(Pd Plating Solution)
  Tetraammine palladium chloride, Pd metal=5 g/L
  Ammonium nitrate=150 g/L
  3 Sodium pyridine sulfonate=3 g/L
  Adjust with pH 8.5 ammonia water
Palladium plating was performed at a bath temperature of 50° C. and a current density of 1 A/dm².

After palladium plating, the product was rinsed with water, and then the surface layer 13 was applied by plating using the following bath composition.
(Ag Plating Solution)
  Potassium silver cyanide=70 g/L
  Potassium cyanide=120 g/L
  Potassium carbonate=30 g/L
Silver plating was performed at a bath temperature of 30° C. and a current density of 2 A/dm² to produce a wire 1.

The plating thickness of the intermediate, layer 12 (palladium plating) and the surface layer 13 (silver plating) were adjusted by varying the plating duration. The plating thickness of each was observed at arbitrary locations by photographing the produced wire 1 with an FIB-SEM device, producing three SEM micrographs at a power of 100,000. In the three photographs, the average value of the maximum and minimum film thickness was used as the film thickness of the intermediate layer 12 (palladium plating) and the surface layer 13 (silver plating).

Figure 3A:
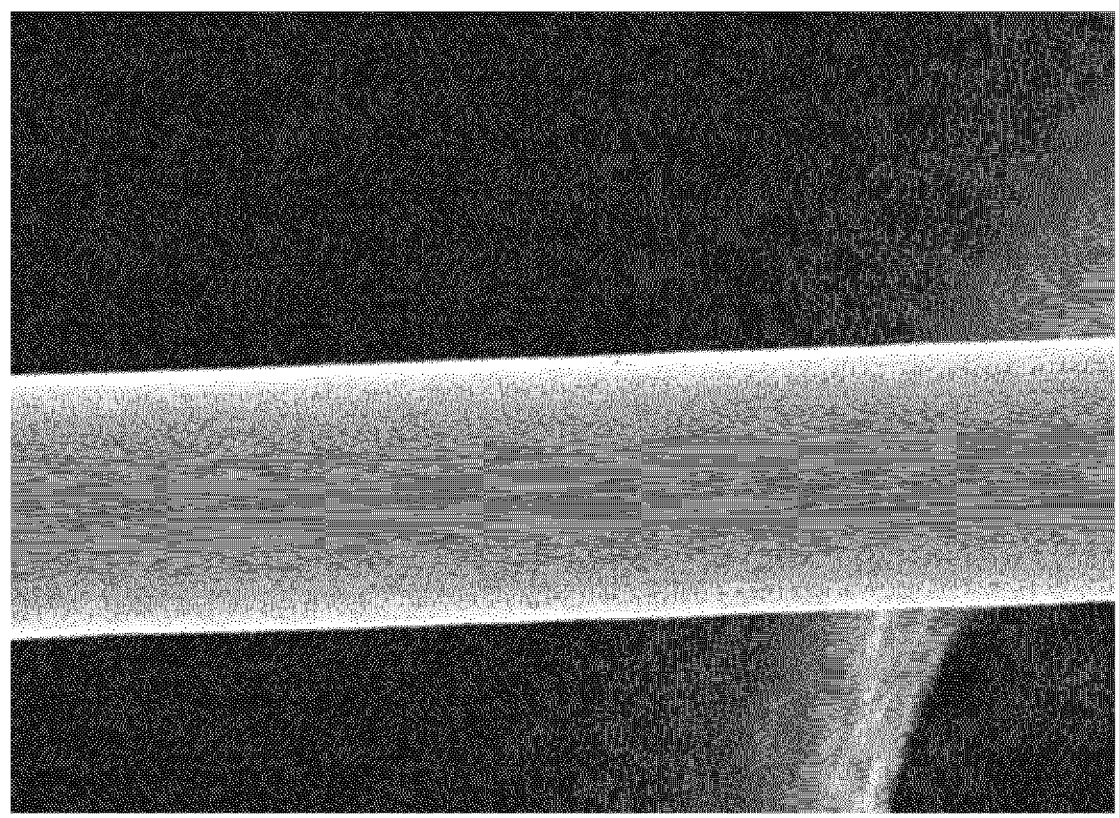
FIG. 3A is a SEM micrograph at a magnification of 1000 times representing the surface of the bonding wire in Example 1.
Figure 3B:
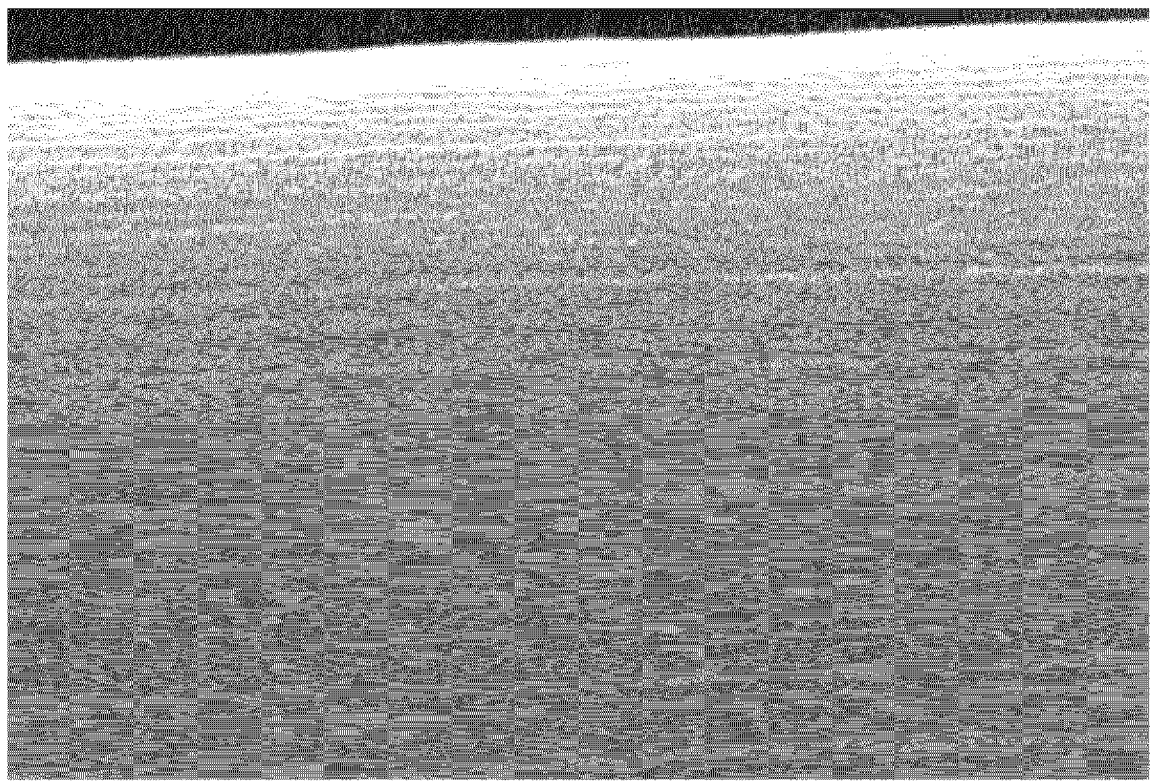
FIG. 3B is a SEM micrograph at a magnification of 5000 times representing the surface of the bonding wire in Example 1.
Figure 4:
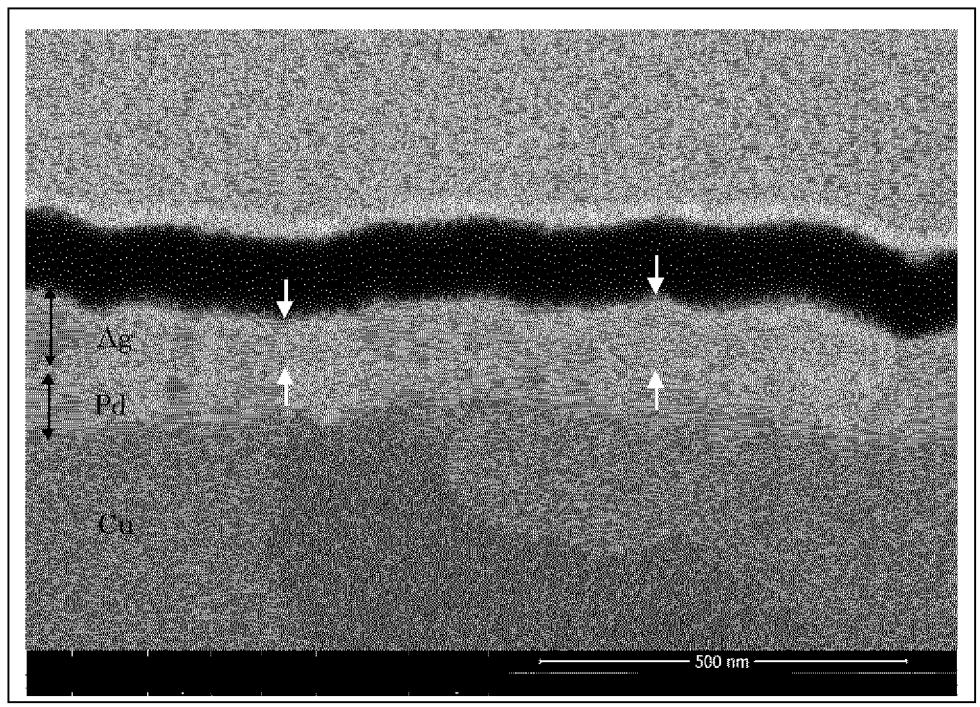
FIG. 4 is a cross-sectional micrograph taken by FIB-SEM representing a cross-sectional view of the bonding wire in Example 1.

FIGS. 3A and 3B show SEM of the surface of the wire in Example 1. Also, a cross-sectional observation photograph by FIB-SEM is shown in FIG. 4.

Next, the metal member 2 (a pair of lead frames) was prepared by applying a nickel plating in a thickness of 2 μm over the surface of a base material made of Olin 194 copper alloy (made by Mitsubishi Shindoh Co., Ltd.), then applying a palladium plating layer with a thickness of 0.03 μm, a gold plating layer with a thickness of 0.004 μm, and a silver plating layer with a thickness of 2.5 μm in that order, b electroplating.

Then, a package 10 in which these leads (shown in FIGS. 1A and 1B) were embedded in the base 4 was formed by transfer molding. Until the light emitting device 100 is divided up into individual pieces, it goes through various steps in the state of an assembly of packages 10 in which a plurality of bases 4 are formed on a lead frame in which a plurality of pairs of leads are linked, but for the sake of convenience, just the one light emitting device 100 (singular) shown in FIGS. 1A and 1B will be described.

The package 10 of the Example has a recessed portion, and the metal member 2 is exposed on the bottom surface of the recessed portion. On the metal member 2, a light-transmissive resin was used as the joining member 5, and a light emitting element 3 having positive and negative electrodes on its upper surface was placed and joined. After this, the metal member 2 and the pad electrodes of the light emitting element 3 were connected by the wire 1 produced as described above. The package 10 was placed on a support table, and the support table was subjected to the following wire connecting step while heated to 180° C. (heater temperature).

An example of the connection conditions for the wire 1 is given below.

The connection conditions (fast-bonding conditions) in connecting the wire 1 onto the pad electrode 31 are such that the weighting is 70 g, the oscillation frequency of the ultrasonic wave is 150 kHz, and the application time of the ultrasonic wave is 30 msec.

The connection conditions in extending the wire 1 connected on the pad electrode 31 and connecting it to the connection part on the metal member 2 (the second bond conditions) are such, that the weighting is 65 g, the oscillation frequency of the ultrasonic wave is 60 kHz, and the ultrasonic wave application time is 10 msec.

After this, a protective film of $SiO_2$ was formed in a thickness of 60 nm by ALD to form a scaling member 6 of a light-transmissive resin containing a YAG phosphor in the recessed portion.

Table 1 shows the results of measuring the total luminous flux for the light emitting device manufactured in this way.

Also shown in Table 1 is the maintenance ratio of the total luminous flux at the outset and the total luminous flux after an emission reliability test (sulfidation test) at a current of 65 mA. The conditions for the sulfidation test were such that the light emitting device was put in an atmosphere of a mixed gas of $H_2S$ and $NO_2$. More specifically, this is a test in which the light emitting device 100 is stored for 600 hours in an atmosphere having a temperature of 40° C. and a relative humidity of 75%, at a concentration of $H_2S$ (2 ppm) and $NO_2$ (4 ppm). The luminous flux maintenance ratio is the output ratio with respect to the output before this sulfidation test.

Just as in Example 1, in Examples 2 to 4, as shown in Table 1, wires 1 of various plating specifications were prepared, and light emitting devices 100 were similarly prepared.

Also, in Comparative Example 1, a light emitting device was produced in the same manner as in Example 1 except that gold wire having a diameter of 18 μm was used.

In Comparative Example 2, a light emitting device was produced in the same manner as in Example 1 except that only palladium plating (40 nm) was applied over the core material copper. In Comparative Example 3, as shown in Table 1, only silver plating (300 nm) was applied over the core material copper, and a light tainting device 100 was similarly prepared.

Table 1 shows the results of measuring the total luminous flux of the light emitting deices thus manufactured.

TABLE 1

| | Core material/ diameter | Intermediate layer/ thickness | Surface layer/ thickness | Initial total luminous flux | Relative initial total luminous flux | Luminous flux maintenance ratio |
|---|---|---|---|---|---|---|
| Examples | | | | | | |
| 1 | Cu 25 μm | Pd 45 nm | Ag 80 nm | 34.91 lm | 100.5% | 87.1% |
| 2 | Cu 25 μm | Pd 30 nm | Ag 300 nm | 34.91 lm | 100.7% | 87.6% |

TABLE 1-continued

|  | Core material/ diameter | Intermediate layer/ thickness | Surface layer/ thickness | Initial total luminous flux | Relative initial total luminous flux | Luminous flux maintenance ratio |
|---|---|---|---|---|---|---|
| 3 | Cu 25 µm | Pd 75 nm | Ag 50 nm | 34.90 lm | 100.5% | 87.9% |
| 4 | Cu 25 µm | Pd 100 nm | Ag 300 nm | 34.97 lm | 100.7% | 88.2% |
| Comparative Examples |  |  |  |  |  |  |
| 1 | Au 18 µm | — | — | 34.73 lm | 100.0% | 63.3% |
| 2 | Cu 25 µm | Pd 40 nm | — | 34.24 lm | 98.6% | 84.6% |
| 3 | Cu 25 µm | — | Ag 300 nm | 34.95 lm | 100.6% | 79.4% |

As shown in Table 1, with the light emitting devices of Examples 1 to 4, regardless of the thickness of the surface layer 13 (silver plating), in every case a high initial total flux was exhibited, and a high luminous flux maintenance ratio could be maintained. However, with the light emitting devices in the comparative examples, when there was only gold wire as in Comparative Example 1 and there was no silver top layer 13 as in Comparative Example 2, or when the surface layer 13 (silver plating) was thin, only a low initial total luminous flux could be obtained. Meanwhile, when the silver top layer was made thicker as in Comparative Example 3, a high initial total luminous flux could be obtained, but the long-term reliability test showed a decrease in total luminous flux.

In all of the Examples 1-4, it was found that the reflectance of the silver containing layer was improved, the light takeoff efficiency of the light emitting device was increased, and the total luminous flux maintenance ratio as indicated by an emission reliability test was also stable.

The light-emitting device according to the present disclosure can be used for backlight devices for liquid-crystal displays, various lighting apparatuses, large size displays, various displays for advertisements and destination guide, and projectors, as well as for image scanners for apparatuses such as digital video cameras, facsimile machines, copying machines, and scanners.

What is claimed is:

1. A light-emitting device comprising:
    a light emitting element having a pad electrode;
    a metal member connected to the pad electrode via a wire, the wire having a layered structure including at least
        a core material containing copper as a main component,
        an intermediate layer containing palladium as a main component, and
        a surface layer containing silver as a main component, the intermediate layer being arranged between the core material and the surface layer.
2. The light-emitting device according to claim 1, wherein
    a thickness of the intermediate layer is from 30 nm to 100 nm, and
    a thickness of the surface layer is from 40 nm to 300 nm.
3. The light-emitting device according to claim 1, wherein the intermediate layer further contains at least one element selected from the group consisting of Cu, Te, Ge, Se, Au and Ag.
4. The light-emitting device according to claim 1, wherein the surface layer further contains at least one element selected from the group consisting of Pd, Au, Se, S, C, N and O.
5. The light-emitting device according to claim 1, wherein a surface layer of the pad electrode is made of at least one element selected from the group consisting of Al, Pd, Pt, Rh and Ru.
6. The light-emitting device according to claim 1, wherein a surface of the metal member includes at least one element selected from the group consisting of Ag, Au, Pd, Rh and Pt.
7. The light-emitting device according to claim 1, wherein a diameter of the core material is equal to or less than 30 µm.
8. The light-emitting device according to claim 1, wherein a thickness of the surface layer is from 40 nm to 300 nm.

* * * * *